United States Patent [19]

Lur et al.

[11] Patent Number: 5,492,848
[45] Date of Patent: Feb. 20, 1996

[54] STACKED CAPACITOR PROCESS USING SILICON NODULES

[75] Inventors: Water Lur, Taipei; Jiunn-Yuan Wu, Guu Keng Shiang; Cheng-Hen Huang, Hsin-Chu, all of Taiwan

[73] Assignee: United Microelectronics Corp., Hsin-Chu, Taiwan

[21] Appl. No.: 214,593

[22] Filed: Mar. 18, 1994

[51] Int. Cl.$^6$ .............................. H01L 21/70; H01L 27/00
[52] U.S. Cl. .................. 437/52; 437/60; 437/919
[58] Field of Search ........................ 437/52, 60, 919

[56] References Cited

U.S. PATENT DOCUMENTS

| | | | |
|---|---|---|---|
| 4,859,622 | 8/1989 | Eguchi | 437/47 |
| 5,068,199 | 11/1991 | Sandhu | 437/52 |
| 5,110,752 | 5/1992 | Lu | 437/47 |
| 5,134,086 | 7/1992 | Ahn et al. | 437/52 |
| 5,158,905 | 10/1992 | Ahn | 437/52 |
| 5,164,881 | 11/1992 | Ahn | 361/313 |
| 5,182,232 | 6/1993 | Chhabra et al. | 437/200 |
| 5,204,280 | 4/1993 | Dhong et al. | 437/52 |
| 5,213,992 | 5/1993 | Lu | 437/52 |
| 5,227,322 | 7/1993 | Ko et al. | 437/47 |
| 5,244,842 | 9/1993 | Cathey et al. | 437/228 |
| 5,254,503 | 10/1993 | Kenney | 437/228 |
| 5,256,587 | 10/1993 | Jun et al. | 437/52 |
| 5,302,540 | 4/1994 | Ko et al. | 437/47 |
| 5,304,828 | 4/1994 | Kim et al. | 257/309 |
| 5,308,786 | 5/1994 | Lur et al. | 437/67 |
| 5,313,100 | 5/1994 | Ishii et al. | 257/751 |
| 5,332,696 | 6/1994 | Kim et al. | 437/233 |
| 5,342,800 | 8/1994 | Jun et al. | 437/52 |
| 5,350,707 | 9/1994 | Ko et al. | 437/52 |
| 5,358,888 | 10/1994 | Ahn et al. | 437/52 |

FOREIGN PATENT DOCUMENTS

| | | |
|---|---|---|
| 3266460 | 3/1990 | Japan. |
| 2308551 | 12/1990 | Japan ................... 257/620 |

OTHER PUBLICATIONS

Yoshimaru et al., *Rugged surface Poly–Si Electrode and Low temperature deposited $Si_3N_4$ for 64MBIT and Beyond STC DRAM cell*, pp. 27.4.1–27.4.4 IEDM, 1990.

Wolf et al., *Silicon Processing For the VLSI Era*, vol. I, Lattice Press 1986, pp. 400–1, 581.

Jun et al., *The Fabrication and Electrical Properties of Modulated Stacked Capacitor for Advanced DRAM Applications*, IEEE (1992).

IBM Technical Disclosure, *Method of Increasing Capacitance Area Using RIE Selectivity*, vol. 35, No. 7 (Dec. 1992).

*Primary Examiner*—Olik Chaudhuri
*Assistant Examiner*—H. Jey Tsai
*Attorney, Agent, or Firm*—Meltzer, Lippe, Goldstein et al.

[57] ABSTRACT

A technique for making a MOST capacitor for use in a DRAM cell utilizes silicon nodules after metal etching. The silicon nodules are used as a mask to selectively form deep grooves in a polysilicon electrode of the capacitor.

4 Claims, 3 Drawing Sheets

STACKED CAPACITOR PROCESS USING SILICON NODULES

FIELD OF THE INVENTION

The present invention relates to a technique for forming a modulated stacked capacitor for use in a Dynamic Random Access Memory (DRAM) cell.

BACKGROUND OF THE INVENTION

A DRAM cell typically comprises a MOS transistor and a capacitor. An example of such a DRAM cell is shown in FIG. 1. The DRAM cell 10 of FIG. 1 comprises the MOSFET 12 and the capacitor 14. A word line is connected to the gate of the MOSFET 14. A bit line is connected to the source of the MOSFET 12. The capacitor 14 is connected to the drain of the MOSFET 12. The state of the DRAM cell 10 is determined by whether or not the capacitor 14 is holding a charge.

The DRAM cell is read by using the bit line to determine whether or not a charge is stored in the capacitor. The DRAM cell is written by using the bit line to add or remove charge from the capacitor. However, the cell can only be read or written when the cell is addressed (i.e. activated) by the word line.

With the continuous advancement of DRAM technology, the chip area used for one DRAM cell is getting smaller. There are two methods used to increase the capacitance of the capacitor in the DRAM cell. One method is to decrease the effective dielectric thickness and the other method is to increase the effective capacitor surface area.

It is expected that future scaled DRAM cells will rely heavily on the quality and storage capacity of ultra thin dielectric materials that are sandwiched between two heavily doped polysilicon and/or silicon electrodes. However, higher capacitance values cannot be obtained without seriously degrading the device retention time. Specifically, films thinner than 50 angstroms present excessive leakage current due to direct carrier tunneling. For a given capacitor dielectric film, the larger the surface area, the larger the capacitance.

FIGS. 2, 3, 4, 5 and 6 illustrate prior art DRAM cells. The DRAM cell 20 of FIG. 2 comprises a MOSFET 22 and a capacitor 24 which are both formed on a silicon substrate 25. The MOSFET 22 comprises the source and drain regions 26 and 28, which regions are separated by the channel 29. It should be noted that the source and drain regions 26, 28 have a conductivity type opposite to that of the substrate. A metal contact 27 directly contacts the source region 26. A gate 30 is formed from polysilicon material (Poly-1) and is separated from the surface of the substrate by an oxide layer 31. An additional oxide region 32 is on top of the gate 30.

The capacitor 24 sits on top of the drain region 28. The capacitor 24 has a first electrode 40 formed by a conducting polysilicon material (poly-2), a thin dielectric layer 42 which may be NO or ONO, and a second electrode 44 which is formed from a conducting polysilicon material (poly-3). The capacitor contacts the drain region 28 in a space between the oxide region 32 and the oxide region 52.

FIG. 3 shows a DRAM cell 20' which is similar to the DRAM cell 20 of FIG. 2. The main difference is that the shape of the poly-2 electrode layer 40, dielectric layer 42 and poly-3 electrode layer 44 have been altered to increase the surface area of the capacitor 24.

FIG. 4 shows a DRAM cell 20" in which the poly-2 electrode 40 has been made rugged to increase the surface area of the capacitor.

FIG. 5 shows a DRAM cell 20''' in which the polysilicon electrode 40 is formed from a plurality of horizontal layers 41 to increase the surface area of the capacitor.

Another capacitor structure which can be used to increase the capacitance of a DRAM cell is known as MOST (modulated stacked) capacitor. (See e.g. Y. K. Jun et al, "The Fabrication and Electrical Properties of Modulated Stacked Capacitor for Advance DRAM Applications" IEEE Electron Device Letters, Vol. 13, No. 8, August 1992, the contexts of which are incorporated herein by reference).

A DRAM cell 20'''' having a MOST capacitor structure is illustrated in FIG. 6. In the capacitor 24 of FIG. 6, the poly-2 electrode 40 comprises a plurality of spaced apart vertical pillars 43. The capacitor dielectric 42 and poly-3 electrode 44 are then deposited over the spaced apart vertical pillars 43. In this manner a capacitor with a large effective surface area is formed in a DRAM cell.

It is an object of the present invention to provide a technique for manufacture of a MOST capacitor for use in a DRAM cell.

SUMMARY OF THE INVENTION

The present invention is a method for making a MOST capacitor for use in a DRAM cell. Specifically, in accordance with the invention, a conductive polysilicon layer is formed on a substrate. A layer of oxide is then formed on the polysilicon layer. A metal layer with silicon precipitates is formed on the oxide layer. The metal layer is then etched away, leaving silicon nodules. Using the silicon nodules as a mask, the oxide layer is etched to form oxide islands. Using the oxide islands as a mask, the polysilicon layer is etched to form pillars. In this manner, the first polysilicon electrode of the MOST capacitor is formed. The dielectric layer is formed on top of the first electrode and then a second polysilicon electrode layer is formed on top of the dielectric.

DETAILED DESCRIPTION OF THE INVENTION

The technique for forming the MOST capacitor is illustrated in FIGS. 7(a), 7(b), 7(c) and 7(d).

Figure 1:
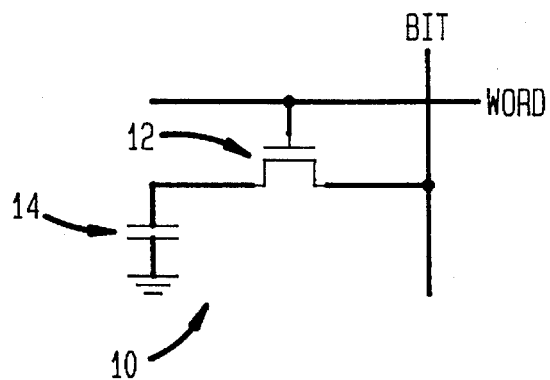
FIG. 1 schematically illustrates DRAM cell.
Figure 2:
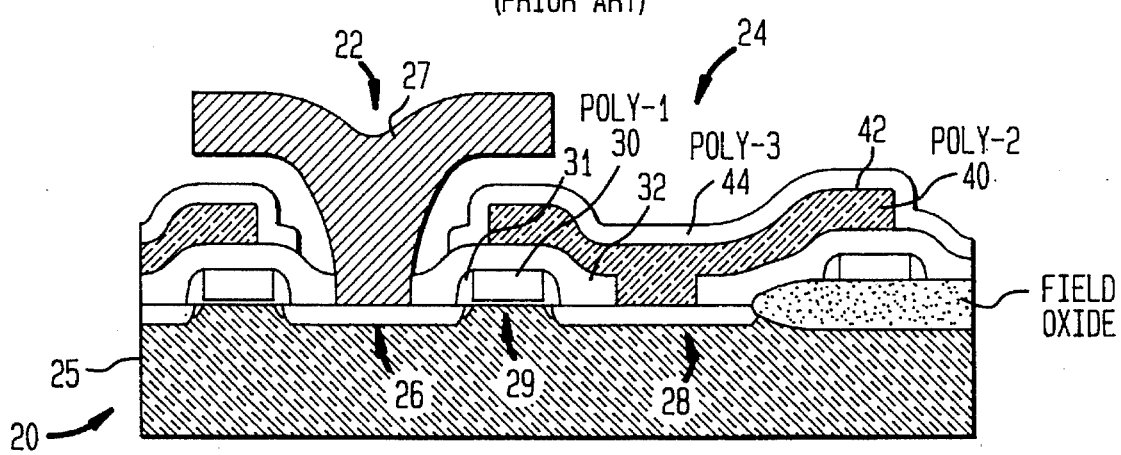
FIGS. 2–6 illustrate various prior art capacitors utilized in DRAM cells.
Figure 3:
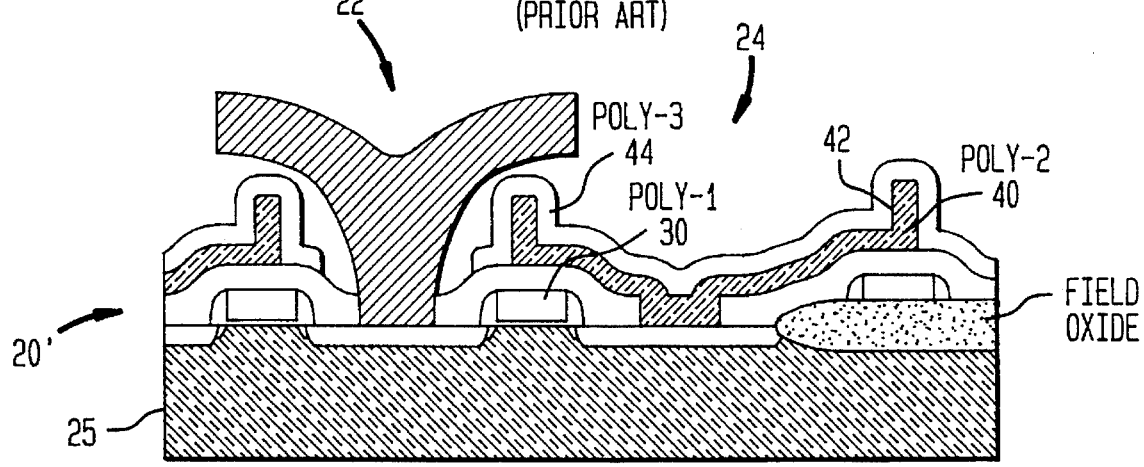
Figure 4:
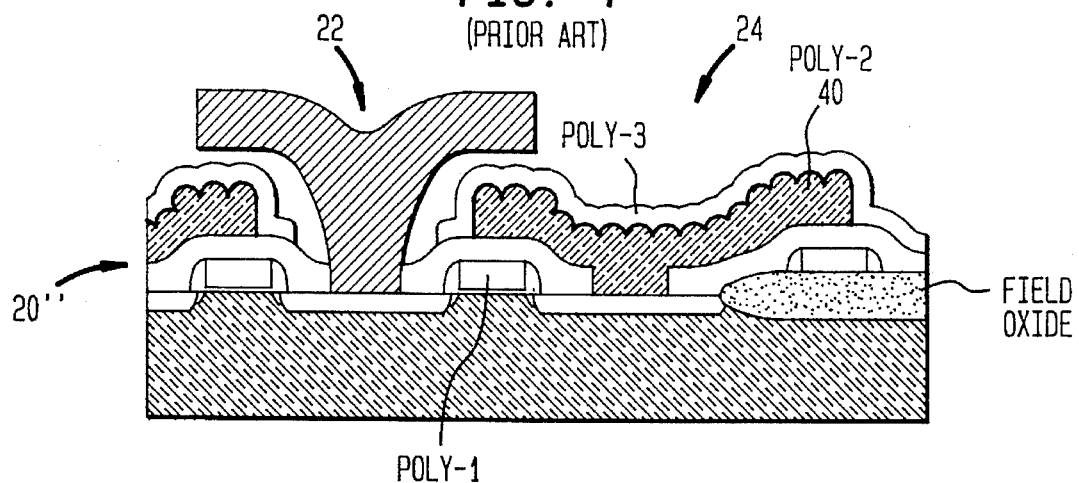
Figure 5:
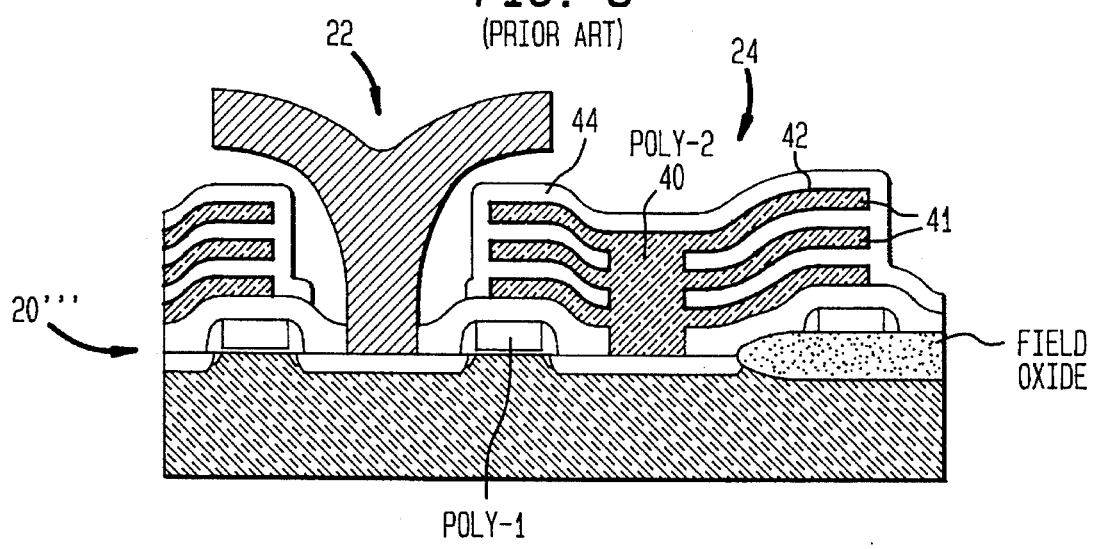
Figure 6:
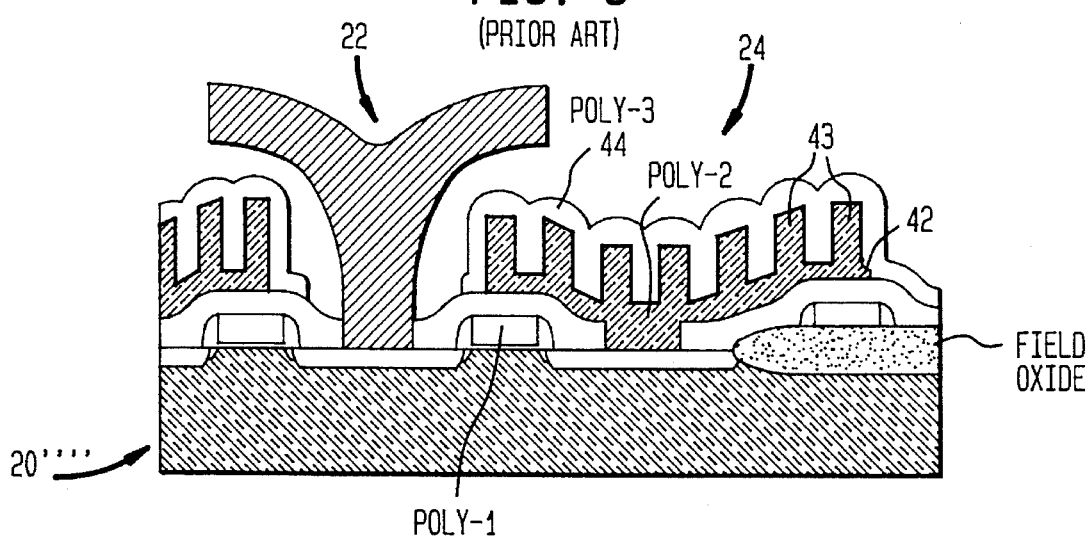
Figure 7A:
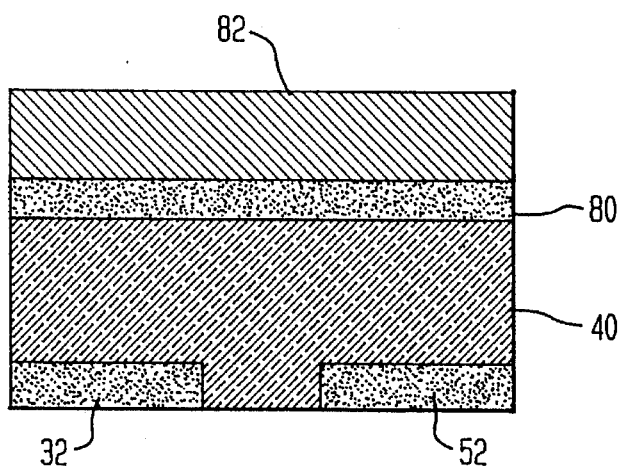
FIGS. 7(a), 7(b), 7(c), and 7(d) illustrate a technique for forming a MOST capacitor for use in a DRAM cell in accordance with the present invention.

1. As shown in FIG. 7(a), a polysilicon (poly-2) electrode layer 40 is deposited on top of the oxide regions 32 and 52 and on top of the substrate 25 (not shown in FIG. 7(A), but see FIGS. 2–6). The poly-2 layer has a thickness between 5 to 10 thousand angstroms and is deposited by chemical vapor deposition or a similar technique after the formation of poly contacts.

2. The polysilicon electrode layer 40 is doped with $POCl_3$ or is implanted with phosphorous or arsenic or the like to become conductive.

3. A thin oxide layer 80 is deposited onto the polysilicon layer 40 with a thickness of between 500–2000 angstroms to act as a mask during polysilicon etching.

4. A metal layer 82, typically, aluminum alloy e.g. Al—Si(1–4%), with a thickness of between 0.8 to 2 microns is deposited on the oxide layer 80. The metal layer 82 is deposited at a temperature of about 400° C. or thermally treated at about 400° C. to form silicon precipitates in the layer 82.

Figure 7B:
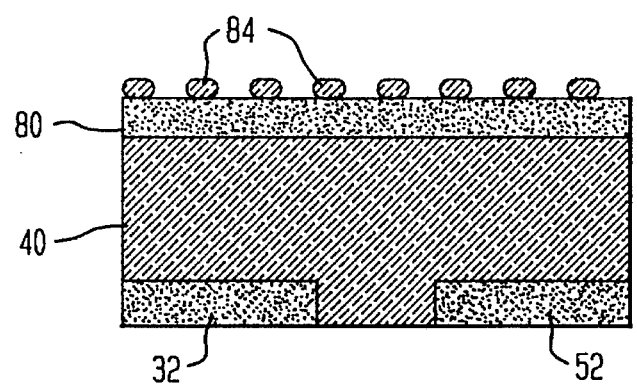

5. The layer 82 is reactively ion etched to leave silicon nodules 84 on the oxide layer 80 with a size between 0.05 to 0.2 microns as shown in FIG. 7(b).

Figure 7C:
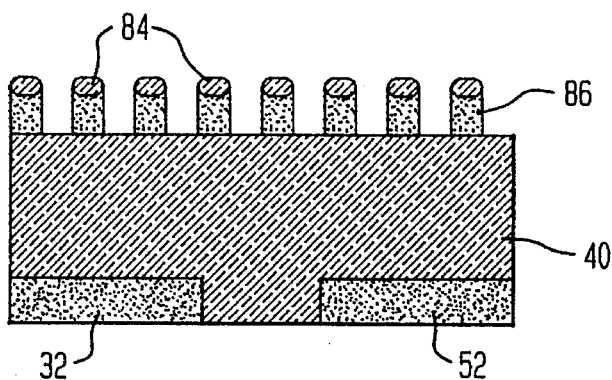

6. Using the silicon nodules 84 as a mask, the oxide layer 80 is reactively ion etched to form oxide islands 86 with a size between 0.05 and 0.2 microns as shown in FIG. 7(c).

Figure 7D:
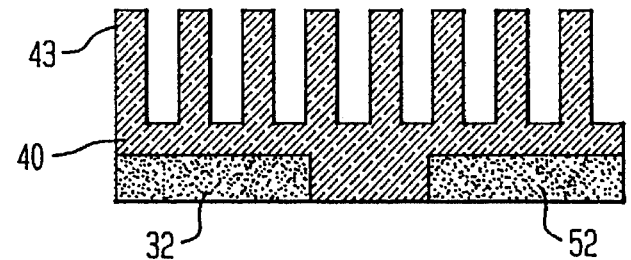

7. The polysilicon layer 40 is then etched to a depth of about 4000–8000 angstroms using the oxide islands as a mask to form polysilicon pillars. The oxide mask is then removed using HF content solution. The resulting pillars 43 are shown in FIG. 7(d). In this manner the layer 40 forms an electrode of the MOST capacitor.

8. The capacitor dielectric layer 42 (see FIG. 6) is formed on the modulated surface (i.e. modulated with the pillars) of polysilicon layer 40. The dielectric layer may be ON or ONO and may be deposited using CVD, PVD or thermal treatment.

9. The dielectric layer 42 and polysilicon electrode layer 40 are etched to isolate the MOST capacitor from the rest of the structure on the substrate.

10. A second polysilicon electrode layer 44 (see FIG. 6) is deposited on top of the dielectric layer, doped to become conductive and etched to complete the capacitor.

11. The metalization (e.g. contact 27 of FIG. 2) is deposited to complete the DRAM cell structure.

In short, a technique for forming a MOST capacitor for use in a DRAM has been disclosed. Silicon nodules are used to form a mask for a polysilicon electrode layer to define pillars in the layer.

Finally, the above described embodiments of the invention are intended to be illustrated only. Numerous alternative embodiments may be devised by those skilled in the art without departing from the spirit and scope of the following claims.

We claim:

1. A method for making a MOST capacitor for use in a DRAM cell comprising the steps of
    (a) forming a conductive polysilicon layer on a silicon substrate,
    (b) forming an oxide layer on the polysilicon layer,
    (c) forming a metal layer on the oxide layer,
    (d) forming silicon precipitates in the metal layer,
    (e) reactive ion etching said metal layer to form silicon nodules on the oxide layer,
    (f) using the silicon nodules as a mask, reactive ion etching the oxide layer to form a plurality of oxide islands,
    (g) using the oxide islands as a mask, etching the polysilicon layer to form a plurality of pillars,
    (h) forming a capacitor dielectric layer on the etched polysilicon layer, and
    (i) forming a second polysilicon layer on the dielectric layer.

2. The method of claim 1 wherein said nodules have a size in the range of 0.05–0.2 microns.

3. The method of claim 1 wherein said step of forming the metal layer forms an aluminum-silicon alloy layer on the oxide layer.

4. The method of claim 3 further comprising the step of, after said step of forming said aluminum-silicon alloy layer, heating said aluminum-silicon alloy layer to a temperature of approximately 400° C.

\* \* \* \* \*